US012756365B2

(12) United States Patent

Afsahi et al.

(10) Patent No.: US 12,756,365 B2

(45) Date of Patent: Oct. 6, 2026

(54) METHOD AND APPARATUS FOR CONTROLLING SECOND HARMONIC-OF POWER AMPLIFIER IN WIDE FREQUENCY RANGE

(71) Applicant: Avago Technologies International Sales Pte. Limited, Singapore (SG)

(72) Inventors: Ali Afsahi, San Diego, CA (US); Dae Hyun Kwon, San Diego, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 484 days.

(21) Appl. No.: 18/458,483

(22) Filed: Aug. 30, 2023

(65) Prior Publication Data

US 2025/0080057 A1 Mar. 6, 2025

(51) Int. Cl.

*H03F 3/45* (2006.01)
*H03F 1/42* (2006.01)
*H03F 3/24* (2006.01)

(52) U.S. Cl.

CPC ............... *H03F 1/42* (2013.01); *H03F 3/245* (2013.01); *H03F 2200/36* (2013.01); *H03F 2200/451* (2013.01)

(58) Field of Classification Search

CPC ........ H03F 1/42; H03F 3/245; H03F 2200/36; H03F 2200/451; H03F 2203/45392; H03F 2203/45731; H03F 1/3211; H03F 3/265; H03F 3/45188; H03F 3/193; H03F 2200/534; H03F 1/30; H03F 1/32; H03F 3/21

USPC .................................................. 330/291, 195

See application file for complete search history.

(56) References Cited

U.S. PATENT DOCUMENTS 6,537,216 B1 3/2003 Shifrin
2005/0140440 A1* 6/2005 Ten Dolle ........... H03F 3/45587 330/252
2008/0079496 A1 4/2008 Thompson et al.

(Continued)

OTHER PUBLICATIONS

Jin, S. et al., Control of IMD Asymmetry of CMOS Power Amplifier for Broadband Operation Using Wideband Signal, IEEE Transactions on Microwave Theory and Techniques, 2013, 61(10):3753-3762.

(Continued)

*Primary Examiner* — Jessica Han
*Assistant Examiner* — Khiem D Nguyen
(74) *Attorney, Agent, or Firm* — Quarles & Brady LLP

(57) ABSTRACT

A power amplifier is provided. The power amplifier includes a first circuit comprising a first transistor and a second transistor coupled respectively to a third transistor and a fourth transistor. The power amplifier also includes a second circuit comprising a transformer having a first winding and a second winding. The first winding comprises a first terminal coupled to the third transistor and a second terminal coupled to the fourth transistor to receive a differential voltage signal with a gain from the first circuit. The second winding comprises a first terminal being grounded and a second terminal serving as an output terminal. The power amplifier circuit further includes a third circuit comprising a programmable capacitor from a midpoint of the first winding to a common node that is coupled to ground. The programmable capacitor is tunable to reduce second harmonic seen at the output terminal.

19 Claims, 3 Drawing Sheets

(56) References Cited

U.S. PATENT DOCUMENTS

| | | | | |
|---|---|---|---|---|
| 2008/0303597 | A1 * | 12/2008 | Inoue | H03F 3/602<br>330/295 |
| 2019/0296703 | A1 * | 9/2019 | Ortiz | H03F 3/193 |

OTHER PUBLICATIONS

European Patent Office, Extended Search Report, Application No. 24196728.0, Jan. 13, 2025, 19 pages.

* cited by examiner

METHOD AND APPARATUS FOR CONTROLLING SECOND HARMONIC-OF POWER AMPLIFIER IN WIDE FREQUENCY RANGE

FIELD OF INVENTION

The subject technology is directed to electronic circuits and methods of operation.

BACKGROUND OF THE INVENTION

A wideband power amplifier is a versatile electronic device that amplifies signals across a broad range of frequencies. It finds application in various fields due to its ability to deliver high power and maintain consistent amplification across a wide frequency spectrum. Wideband power amplifiers are used in telecommunications systems, such as cellular networks, where they are used to amplify signals in the RF (Radio Frequency) range, ensuring efficient transmission and reception of signals across multiple frequency bands, and enabling reliable communication over a wide coverage area. In wireless communication systems, such as Wi-Fi networks, Bluetooth devices, or satellite communication systems, wideband power amplifiers are utilized to amplify signals in the desired frequency range to enable long-range communication, improve signal quality, and ensure reliable data transmission across various wireless protocols.

In many applications using the wideband power amplifiers such as RF power amplifiers, drive amplifiers, and low-noise amplifiers, harmonic controls may be needed to minimize the presence of the second harmonic to maintain signal integrity, improve linearity, and prevent distortion throughout the entire frequency range of operation. The present application provides a simple but effective method and apparatus for controlling second harmonic of power amplifier in wide ranges of frequencies.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF THE INVENTION

Figure 1:
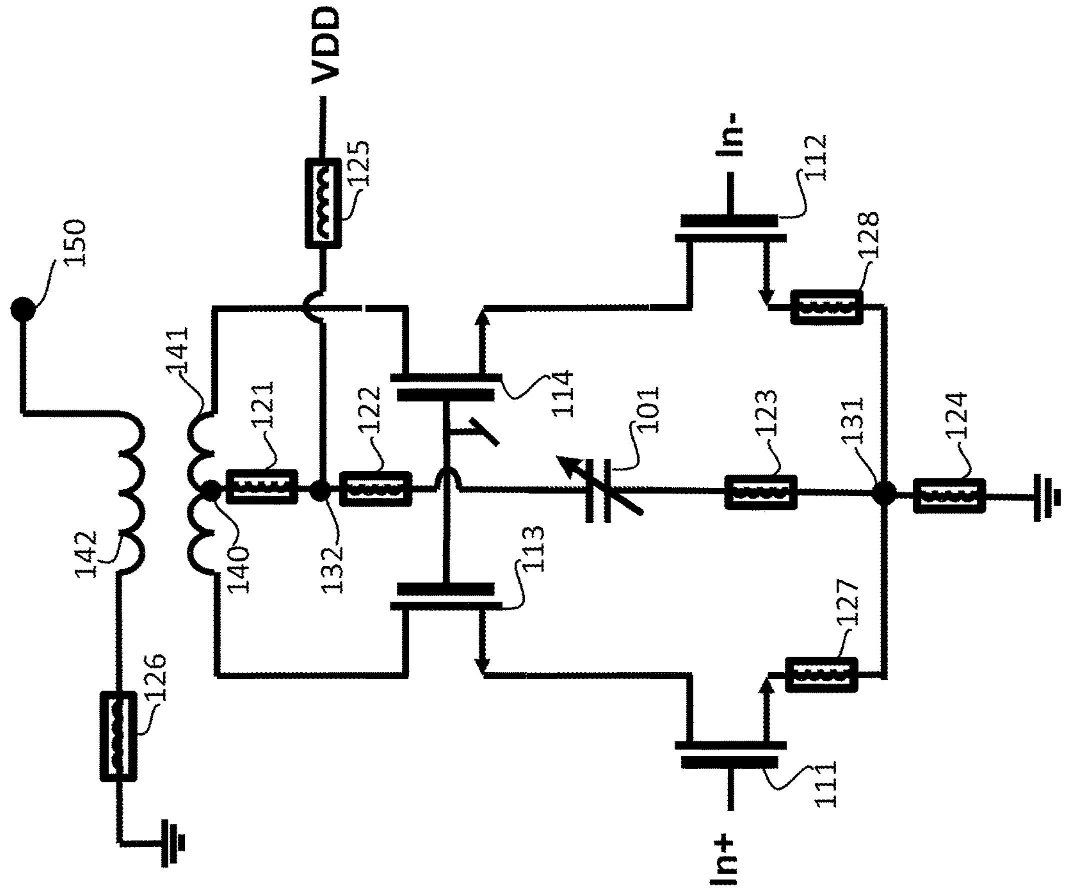
FIG. 1 is a circuit diagram of a power amplifier according to an embodiment of the subject technology.

The current invention relates to electronic circuits and methods of operation. Specifically, it presents a power amplifier circuit that features a programmable decoupling capacitor to tune the center-tap impedance and affect the power amplifier common-mode behavior and efficiency. The optimized center-tap impedance leads to the control of the second harmonic signal for each operating frequency of the power amplifier in a wide range. There are other embodiments as well.

In the following description, for the purposes of explanation, numerous details are set forth to provide a thorough understanding of the described embodiments. It will be apparent to one skilled in the art, however, that other embodiments may be practiced without some of these details. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

In the following detailed description, numerous specific details are set forth in order to provide a more thorough understanding of the subject technology. However, it will be apparent to one skilled in the art that the subject technology may be practiced without necessarily being limited to these specific details. In other instances, well-known structures and devices are shown in block diagram form, rather than in detail, in order to avoid obscuring the subject technology.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

When an element is referred to herein as being "disposed" in some manner relative to another element (e.g., disposed on, disposed between, disposed under, disposed adjacent to, or disposed in some other relative manner), it is to be understood that the elements can be directly disposed relative to the other element (e.g., disposed directly on another element), or have intervening elements present between the elements. In contrast, when an element is referred to as being "disposed directly" relative to another element, it should be understood that no intervening elements are present in the "direct" example. However, the existence of a direct disposition does not exclude other examples in which intervening elements may be present.

Similarly, when an element is referred to herein as being "bonded" to another element, it is to be understood that the elements can be directly bonded to the other element (without any intervening elements) or have intervening elements present between the bonded elements. In contrast, when an element is referred to as being "directly bonded" to another element, it should be understood that no intervening elements are present in the "direct" bond between the elements. However, the existence of direct bonding does not exclude other forms of bonding, in which intervening elements may be present.

Likewise, when an element is referred to herein as being an "electronic circuit" or simply "circuit", it is commonly recognized as a building block of modern electronics. Circuits are composed of various electronic components such as resistors, capacitors, inductors, diodes, transistors, and integrated circuits. These components are carefully selected and interconnected to create a circuit that can perform a specific task or carry out a particular function. Circuits can be as simple as a basic switch that turns a light on and off, or they can be incredibly complex, such as those found in advanced computer systems, communication devices, or medical equipment. They can be categorized into different types based on their purpose, including amplifiers, oscillators, filters, power supplies, and logic gates, among others.

Moreover, the terms left, right, front, back, top, bottom, forward, reverse, clockwise and counterclockwise are used for purposes of explanation only and are not limited to any fixed direction or orientation. Rather, they are used merely to indicate relative locations and/or directions between various parts of an object and/or components.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth should be understood as being modified in all instances by the term "about." In this application, the use of the singular includes the plural unless specifically stated otherwise, and use of the terms "and" and "or" means "and/or" unless otherwise indicated. Moreover, the use of the terms "including" and "having," as well as other forms, such as "includes," "included," "has," "have," and "had," should be considered non-exclusive. Also, terms such as "element" or "component" encompass both elements and components comprising one unit and elements and components that comprise more than one unit, unless specifically stated otherwise.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items. By way of example, the phrases "at least one of A, B, and C" or "at least one of A, B, or C" each refer to only A, only B, or only C; and/or any combination of A, B, and C. In instances where it is intended that a selection be of "at least one of each of A, B, and C," or alternatively, "at least one of A, at least one of B, and at least one of C," it is expressly described as such.

One general aspect includes an apparatus configured as a wideband power amplifier. The apparatus includes a first circuit comprising a first transistor and a second transistor coupled respectively to a third transistor and a fourth transistor, the first transistor comprising a first gate configured to receive a first voltage input, the second transistor comprising a second gate configured to receive a second voltage input, the third transistor comprising a source coupled to a drain of the first transistor, and the fourth transistor comprising a source coupled to a drain of the second transistor. The apparatus also includes a second circuit may include a second circuit comprising a transformer having a first winding and a second winding, the first winding comprising a first terminal coupled to a drain of the third transistor and a second terminal coupled to a drain of the fourth transistor, the first winding being configured to draw a current associated with a differential voltage signal based on the first voltage input and the second voltage input, the second winding comprising a third terminal being grounded via a sixth resistor and a fourth terminal serving as an output terminal for outputting a single-ended voltage signal. The apparatus also includes a third circuit comprising a first resistor, a second common node, a second resistor, a programmable capacitor, a third resistor, a first common node, and a fourth resistor coupled in series sequentially from a midpoint of the first winding to a ground terminal.

Implementations may include one or more of the following features. The apparatus may include a fourth circuit comprising a fifth resistor having a first terminal coupled to a DC voltage VDD and a second terminal coupled to the second common node connecting to both the first resistor and the second resistor. The programmable capacitor may include a switched capacitor array. The programmable capacitor may include a digitally controlled capacitor. The programmable capacitor may include a MEMS-based capacitor. The programmable capacitor may include a capacitance that is adjustable in a range from 0.1 pF to 10 μF by a controller based on frequency of the differential voltage signal in a range from 1 MHz to 19 GHz to reduce a second harmonic signal at the output terminal by at least 10 dBm. The first voltage input may include a first voltage signal at a frequency selected from 1 MHz to 19 GHz, the second voltage input may include a second voltage signal with a same value of the first voltage signal but in opposite polarity at the same frequency. The third transistor and the fourth transistor may include a common gate terminal being grounded. The first transistor may include a source coupled to a seventh resistor which is coupled to the first common node. The second transistor may include a source coupled to an eighth resistor which is coupled to the first common node.

Another general aspect includes an apparatus for suppressing second harmonic in wideband power amplifier. The apparatus also includes a first pair of transistors configured to receive a first voltage input and a second voltage input respectively at their gate terminals. The apparatus may include a second pair of transistors comprising respective sources coupled to respective drains of the first pair of transistors, the second pair of transistors being configured to provide a differential voltage signal based on the first voltage input and the second voltage input. The apparatus also includes a transformer comprising a primary winding and a secondary winding, the primary winding being coupled to respective drains of the second pair of transistors to receive a current signal associated with the differential voltage signal, the primary winding comprising a midpoint that separates the primary winding to two sections with equal resistances, the secondary being coupled between a ground terminal and an output terminal. The apparatus also includes at least a programmable capacitor coupled between the midpoint of the primary winding and a first common node that is coupled to the first pair of transistors.

Implementations may include one or more of the following features. The apparatus may include a first resistor coupled between the midpoint of the primary winding to a second common node, a second resistor coupled between the second common node and the programmable capacitor, a third resistor coupled between the programmable capacitor and the first common node, a fourth resistor coupled between the first common node and ground. The apparatus further includes a fifth resistor coupled between a DC voltage VDD and the second common node. The apparatus also includes a sixth resistor coupled between the secondary winding and ground, a seventh resistor coupled between a drain of a first one of the first pair of transistors and the first common node, and an eighth resistor coupled between a drain of a second one of the first pair of transistors and the first common node. The differential voltage signal may include a frequency in a range from 1 MHz to 19 GHz. The programmable capacitor includes a switched capacitor array. The programmable capacitor includes a MEMS-based capacitor. The differential voltage signal includes a frequency range from 1 MHz to 19 GHz. The programmable capacitor includes a capacitance that is adjustable in a range from 0.1 pF to 10 μF to reduce a second harmonic signal at the output terminal by at least 10 dBm.

Yet another general aspect includes a method for reducing second harmonic interference to output of a wideband power amplifier. The method includes configuring a first pair of transistors to have respective two gates to receive a first voltage input and a second voltage input respectively. The method also includes configuring a second pair of transistors to provide a differential voltage signal based on the first voltage input and the second voltage input. The method includes providing a transformer comprising a first winding and a second winding, the first winding comprising a midpoint that separates the first winding to two sections with equal resistances. The method additionally includes coupling the first winding between respective drains of the second pair of transistors to receive a current signal associated with the differential voltage signal. The method further includes coupling the second winding between a ground terminal and an output terminal. The method includes coupling at least a programmable capacitor between the midpoint of the first winding and a first common node that is coupled to respective sources of the first pair of transistors, the programmable capacitor being configured to allow capacitance adjustment from 0.1 pF to 10 μF. Furthermore, the method includes coupling a power supply to a second common node of the center-tap line that is connected to the midpoint of the first winding via a first resistor and connected to the programmable capacitor via a second resistor. Moreover, the method includes coupling the first common node to the programmable capacitor via a third transistor and to ground via a fourth resistor. The method also includes using a controller to adjust the capacitance of the programmable capacitor to reduce second harmonic signals at the output terminal for each frequency of the differential voltage signal.

FIG. 1 is a circuit diagram of a power amplifier according to an embodiment of the subject technology. This diagram is merely an example, which should not unduly limit the scope of the claims. One of ordinary skill in the art would recognize many variations, alternatives, and modifications. In an embodiment, the power amplifier circuit includes a first circuit comprising at least a first transistor 111 and a second transistor 112 for respectively receiving a first voltage input In+ and a second voltage input In− at their gate terminals. The source terminal of the first transistor 111 is coupled via a resistor 127 to a first common node 131. The source terminal of the second transistor 112 is coupled via another resistor 128 to the first common node 131. Optionally, the first voltage input In+ is a voltage signal with a voltage value V at a frequency in a wide range from 1 MHz to 19 GHz. Optionally, the second voltage input In− is a voltage signal with the same value as the first voltage input but with an opposite polarity, i.e., −V, at the same frequency. In another embodiment, a differential voltage signal (In+−In−) is received by the gate terminals of the first and second transistors. The first common node 131 is grounded via a resistor 124.

Referring to FIG. 1, the first circuit also includes a third transistor 113 and a fourth transistor 114 configured to provide a gain for the differential voltage signal (In+−In−). The third transistor 113 and the fourth transistor 114 have a common gate terminal that is grounded. The third transistor 113 has its source terminal coupled to the drain terminal of the first transistor 111. The fourth transistor 114 also has its source terminal coupled to the drain terminal of the second transistor 112, forming a pair of push-pull structure in a complementary manner to amplify the differential voltage signal. Transistor 113 amplifies the positive half of the input signal, while the transistor 114 amplifies the negative half. In the embodiment, the first circuit is a gain circuit configured to provide a differential voltage signal with a gain.

Additionally, the power amplifier circuit includes a second circuit comprising at least a transformer having a first winding 141 and a second winding 142. The first winding 141 has its two terminals respectively coupled to the drain terminals of the third transistor 113 and fourth transistor 114, to draw a current signal which is associated with the gain of the differential voltage signal across the two terminals of the first winding 141. The first winding is primary winding of the transformer. The second winding 142 has one terminal being grounded via a resistor 126 and another terminal being served as an output terminal 150. The second winding is the secondary winding of the transformer. In the embodiment, the second circuit is an output circuit configured to receive the differential voltage signal with the gain at the two terminals of the first winding and output a single-end voltage signal at the output terminal of the second winding.

Referring to FIG. 1 again, the power amplifier circuit includes a third circuit comprising at least a programmable capacitor 101 coupled to several resistors in a serial connection. In an embodiment, the serial connection of the third circuit starts with a first resistor 121 having one terminal coupled to a midpoint 140 of the first winding 141 and another terminal coupled to a second common node 132. The serial connection is followed by a second resistor 122 having one terminal coupled to the second common node 132 and another terminal coupled to the programmable capacitor 101. Further the programmable capacitor 101 is coupled to a third resistor 123 which is then connected to the first common node 131. The center-tap is connected to midpoint 140 of the first winding 141 where the two amplified signals are combined. Additionally, a fourth circuit is included by coupling the second common node 132 to a power supply VDD via a resistor 125. The third circuit 123 serves as a reference point for the output signals, ensuring that the positive and negative halves of the amplified waveform are balanced and properly aligned. It helps in canceling out even-order harmonics and reducing distortion in the output signal. By coupling power supply VDD to the center-tap, the second circuit can effectively utilize the entire supply voltage, allowing for improved efficiency and power handling capability. Additionally, it helps in achieving a balanced output signal with reduced distortion by common-mode signals and second harmonics seen at the output terminal 150 especially for wideband power amplifier. A second harmonic signal is essentially a frequency component that is twice the frequency of the fundamental signal being amplified. It is often a byproduct of the amplifier's non-linearities, arising from components like transistors, diodes, or even from passive intermodulation in connectors and transmission lines. A second harmonic signal can distort the desired output and lower the amplifier's fidelity. In communications, this could mean increased bit-error rates or reduced data throughput. In frequency-sensitive applications like RF communications, a second harmonic can occupy additional bandwidth, potentially causing interference with other channels or services, causing wasted power, reducing the overall efficiency of the amplifier. Therefore, reducing or suppressing the second harmonic signal at output of the wideband power amplifier is one of solutions provided by the subject technology in this disclosure.

The midpoint of the primary winding on a transformer may be typically found during the construction of the transformer. It would involve winding half of the total turns of coils, then marking or connecting to that point, then winding the remaining turns. This is known as a center-tap transformer. A midpoint simply separates the primary winding to two sections with equal resistances. If the transformer is already built, to find the midpoint of the primary winding, at least a technique that involves may include applying a known voltage across the entire primary winding, then measuring the voltage at various points along the winding until you find a point where the voltage is half of the total. Optionally, for transformers that are not center-tapped, an alternative way to achieve a similar outcome is to use two identical transformers and connect them in series, taking the midpoint between the two transformers. The term "center-tap impedance" in the context of a wideband power amplifier typically refers to the impedance seen at the center-tap (i.e., an impedance at midpoint of the primary winding) of a transformer or inductor that is often used in the output stage of such amplifiers. The center-tap configuration is usually employed for purposes like phase splitting or providing a DC return path.

The operating frequency range of wideband power amplifiers can vary depending on their design, specifications, and intended applications, which may cause variation of the center-tap impedance. Or in another view, changing center-impedance would affect the performance of the wideband power amplifier in many aspects. A typical wideband power amplifier is designed to cover a broad frequency range, often spanning from a few megahertz (MHz) up to several gigahertz (GHz). In many cases, wideband power amplifiers are used in applications such as wireless communications, radar systems, test and measurement equipment, and wideband signal amplification. These applications require the amplification of signals across a wide frequency spectrum. For example, a wideband power amplifier used in wireless communications might operate in the range of 100 MHz to 3 GHz, covering popular frequency bands used for cellular networks, Wi-Fi, Bluetooth, and other wireless communication standards. In other cases, wideband power amplifiers designed for microwave applications, such as radar systems or satellite communications, may operate in the frequency range of 1 GHz to 19 GHz or even higher. In an embodiment, controlling the center-tap impedance can effectively affect common-mode behavior of the power amplifier for a wide frequency range. The center-tap impedance should be properly matched to the source or load impedance to ensure efficient power transfer and minimize signal reflections. For the power amplifier circuit in the present disclosure, the center-tap impedance can be controlled and adjusted by tuning capacitance of the programmable capacitor. An optimized center-tap impedance can reduce or minimize second harmonic at any operating frequency of the power amplifier. The center-tap impedance also can affect the common-mode impedance seen by the common-mode signal, potentially degrading the common-mode rejection performance.

In some embodiments, the programmable capacitor 101 is provided as a capacitor or capacitor array with its capacitance being adjustable externally. For example, the programmable capacitor 101 is provided as a switched capacitor array. The switched capacitor array generally comprises an array of capacitors coupled in parallel and respectively controlled by an array of switches using clock signals or control logic provided from a controller to connect or disconnect the capacitors to tune the capacitance. The capacitance range of a switched capacitor array is determined by the number and values of the individual capacitors within the array. The capacitance range can vary from a few picofarads to hundreds or thousands of picofarads, depending on the design and configuration of the array. In another example, the programmable capacitor 101 is provided as a digitally controlled capacitor. Digitally controlled capacitors typically provide discrete steps of capacitance adjustment. The range of capacitance values achievable depends on the number and values of the individual capacitors within the structure. The capacitance range can vary from a few picofarads to microfarads or higher, depending on the specific design and implementation. In another example, the programmable capacitor 101 may be provided as a MEMS-based capacitor. The MEMS-based capacitor comprises electrode plates being actuated using electrostatic, thermal, or piezoelectric mechanism to adjust their gaps for changing capacitances. MEMS-based capacitors can provide a wide range of capacitance values, often from picofarads to tens or even hundreds of microfarads. The capacitance range depends on the specific design and structure of the MEMS-based capacitor, including the size of the plates and the actuation mechanism. Given their microscopic size and precision engineering, MEMS capacitors often exhibit a high Q-value, making them desirable for RF and microwave applications. In general, each type of programmable capacitor may be controlled by an external controller (i.e., no part of the amplifier circuit) so that the center-tap impedance can be adjusted in situ based on real-time performance and individual system setting.

Figure 2:
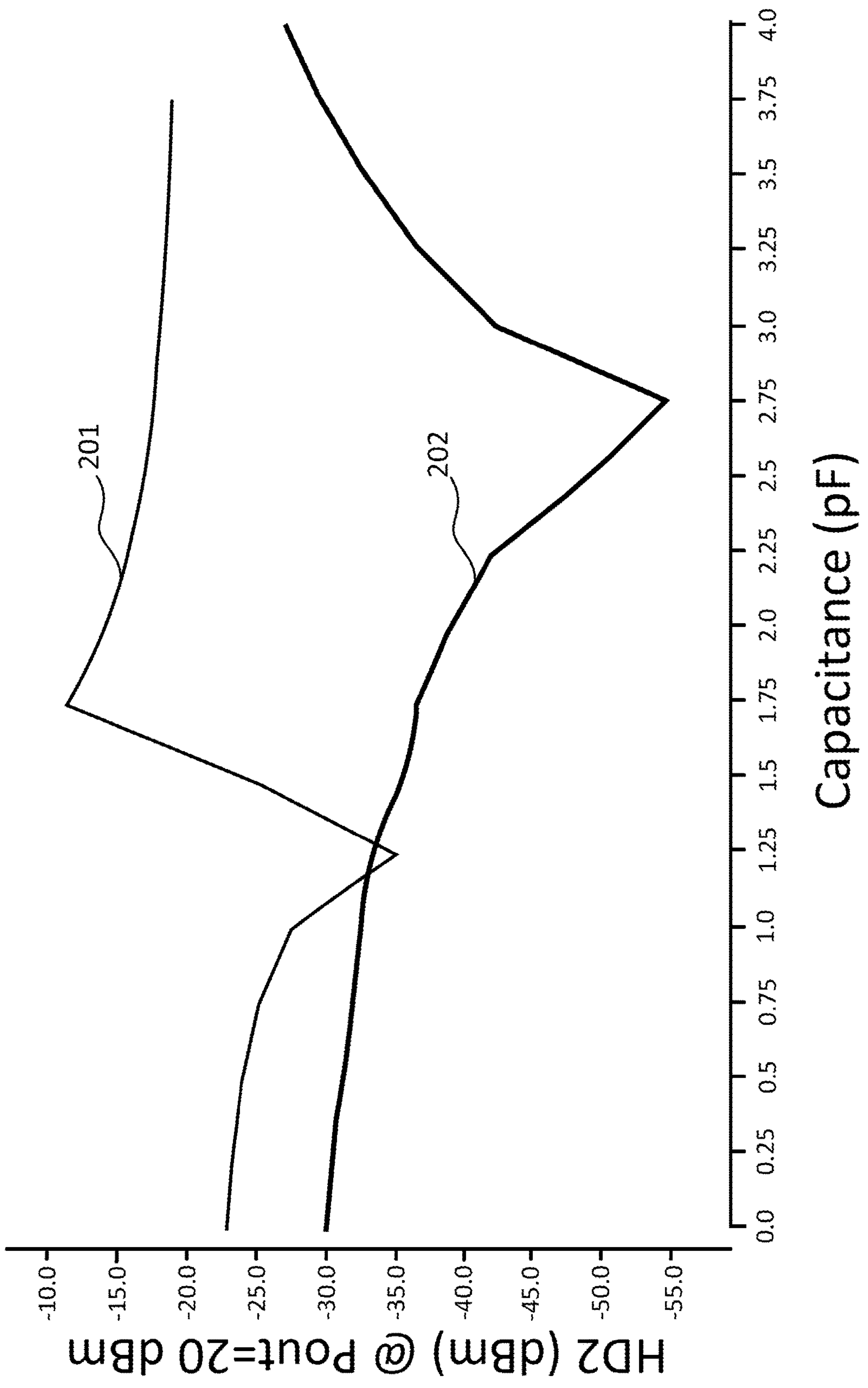
FIG. 2 is a plot of second harmonic signal power level against decoupling capacitor capacitance based on an output signal power at 20 dBm according to an embodiment of the subject technology.

FIG. 2 is a plot of second harmonic signal power level against decoupling capacitor capacitance based on an output signal power at 20 dBm according to an embodiment of the subject technology. This diagram is merely an example, which should not unduly limit the scope of the claims. One of ordinary skill in the art would recognize many variations, alternatives, and modifications. FIG. 2 shows two examples of the second harmonic signal power density (HD2) versus the capacitance of the programmable capacitor in a power amplifier at two different operating frequencies. The second harmonic signal power density is measured at the output terminal 150 with the output power density being set to 20 dBm as a reference for both examples. Curve 201 corresponds to the power amplifier with an operating frequency at 7 GHz and the second harmonic signal is at 14 GHz. The variation of the HD2 shows a minimum value when the capacitance is set to 1.25 pF for 7 GHz operation. Curve 202 corresponds to the power amplifier with an operating frequency at 5 GHz and the second harmonic signal at 10 GHz. The plot shows that if the capacitance of the programmable capacitor is chosen to be 2.75 pF, the HD2 can be reduced to a lowest level.

Figure 3:
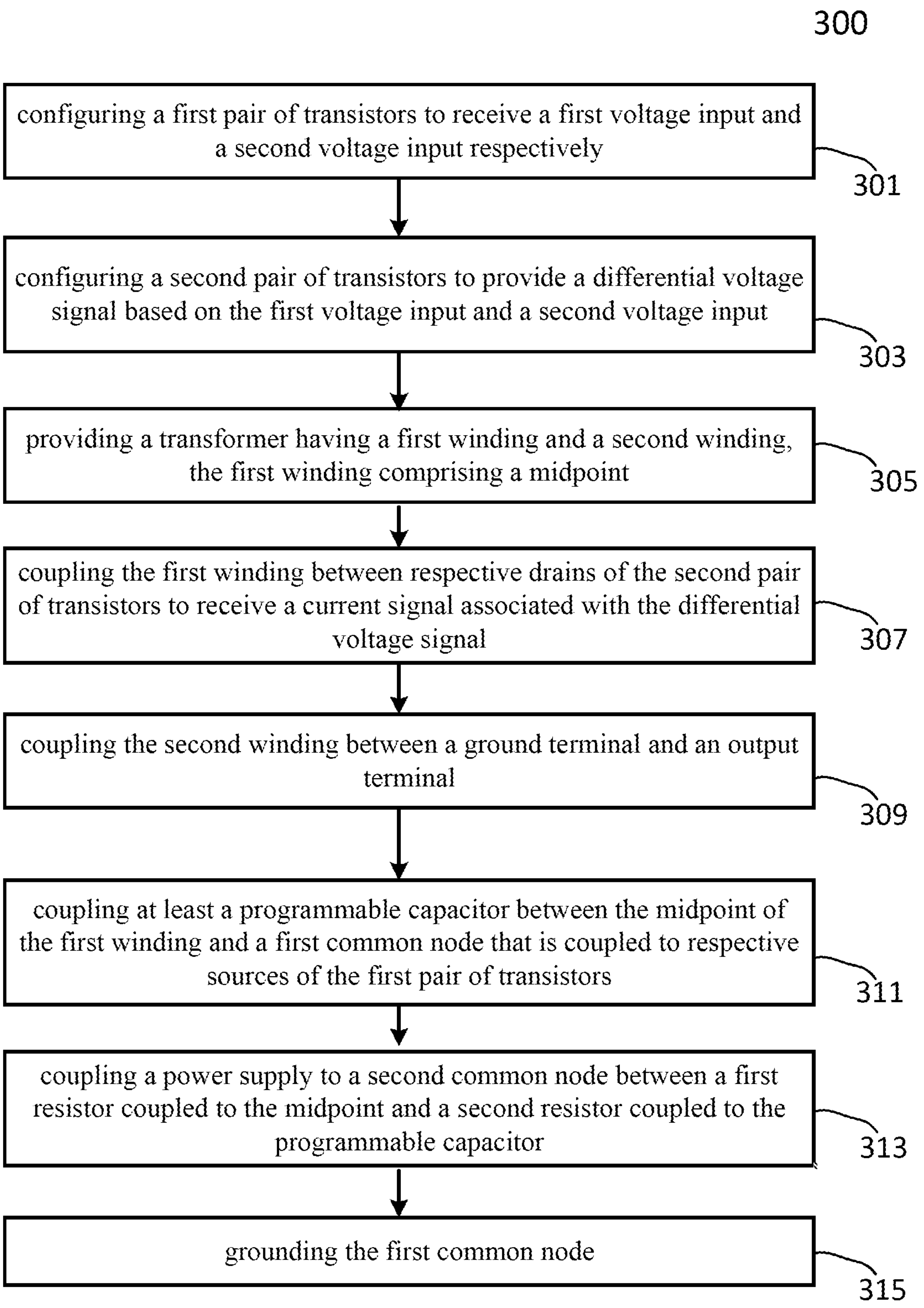
FIG. 3 is a flow chart illustrating a method for controlling second harmonic in wideband power amplifier according to an embodiment of the subject technology.

FIG. 3 is a flow chart illustrating a method for controlling second harmonic in wideband power amplifier according to an embodiment of the subject technology. This diagram is merely an example, which should not unduly limit the scope of the claims. One of ordinary skill in the art would recognize many variations, alternatives, and modifications. In an embodiment, method 300 is provided, based on a power amplifier circuit introduced in FIG. 1, for controlling second harmonic in the wideband power amplifier and enhancing the amplifier efficiency with reduced common-mode distortion. Merely as an example, method 300 includes step 301 of configuring a first pair of transistors to have their gates to receive a first voltage input and a second voltage input respectively. The first pair of transistors, in an embodiment, is provided as the first transistor 111 and the second transistor 112 and routed according to the circuitry shown in FIG. 1. The gate terminal of the first transistor receives the first voltage input. The gate terminal of the second transistor receives the second voltage input. Optionally, the first voltage input represents a positive voltage signal, and the second voltage input represents a negative voltage signal. Each of the two signals may have the same value and same frequency. The frequency may be one in a wide range from 1 MHz to 10 s GHz for this wideband power amplifier. The first voltage input and the second voltage input may be considered as a differential voltage signal for the wideband power amplifier. Optionally, the source terminals of the first pair of transistors are respectively coupled to a first common node (with two coupling resistors).

Referring to FIG. 3, method 300 further includes step 303 of configuring a second pair of transistors to provide a differential voltage signal based on the first voltage input and the second voltage input. In an embodiment, the second pair of transistors is provided as the third transistor 113 and the fourth transistor 114 which are routed as shown in FIG. 1. In particular, the third transistor 113 has its source terminal coupled to the drain terminal of the first transistor 111. The fourth transistor 114 has its source terminal coupled to the drain terminal of the second transistor 112. The third transistor and the fourth transistor share a common gate terminal which is grounded. The third transistor 113 combined with the first transistor 111 forms a push-pull functional structure that amplifies the first voltage input (i.e., the positive half). The fourth transistor 114 combined with the second transistor 112 also forms a push-pull functional structure to amplify the second voltage input (i.e., the negative half).

Additionally, method 300 includes step 305 for providing a transformer having a first winding and a second winding, as shown in FIG. 1, at an output stage of the wideband power amplifier circuit. The first winding includes a midpoint that separates the first winding to two sections with equal resistances. More specifically, method 300 includes step 307 for coupling the first winding between respective drains of the second pair of transistors to receive a current signal associated with the differential voltage signal. The current signal may be converted to an amplified voltage signal across the two terminals of the first winding. The first winding is the primary winding of the transformer. Further, method 300 also includes step 309 for coupling the second winding between a ground terminal and an output terminal. As shown in FIG. 1, one terminal of the second winding 142 is coupled first to a resistor 126 then to the ground. Another terminal of the second winding 142 is the output terminal 150. The second winding is the secondary winding of the transformer. In an implementation of the method, the transformer is a center-taped transformer, whose midpoint of the primary winding is predetermined.

Further, method 300 includes step 311 for coupling at least a programmable capacitor between the midpoint of the first winding and a first common node that is coupled to respective sources of the first pair of transistors. As shown in FIG. 1, the third circuit includes a first resistor 121, a second resistor 122, the programmable capacitor 101, and a third resistor 123 connected in series, in which the first resistor 121 is coupled to the midpoint of the first winding of the transformer and the third resistor is further coupled to the first common node 131. The center-tap line associated with the programmable capacitor allows the transformer at the output stage of the power amplifier to adjust the coupling between the amplifier and the load and to add a control mechanism for reducing noise such as second harmonic signal. In an embodiment, the programmable capacitor can be externally controlled to allow capacitance adjustment during operation of the wideband power amplifier for each operating frequency in a wide range. The programmable capacitor provides a way to effectively adjust impedance in the center-tap line which in turns reduces or eliminates the second harmonic signal from the output signal.

Further, method 300 includes step 313 for coupling a power supply to a second common node of the center-tap line that is coupled to the midpoint and a second resistor that is coupled to the programmable capacitor. In particular, in the example of FIG. 1, the power supply VDD is added to the second common node 132 that is joined commonly by the first resistor 121 and the second resistor 122 in the center-tap line. The power supply is a voltage source coupled via a resistor 125 to the second common node 132. By coupling the power supply to the center-tap line, the output stage of the wideband power amplifier can effectively utilize the entire supply voltage, allowing for improved efficiency and power handling capability.

Furthermore, method 300 includes step 315 for grounding the first common node. In particular, in the example of FIG. 1, the first common node further is coupled to a fourth resistor 124 which is connected to the ground. These steps provide a wideband power amplifier that can be operated for a wide frequency range, for example, used as an RF power amplifier, a drive amplifier, or a low-noise amplifier in many applications.

Moreover, the method for controlling second harmonic signal of the wideband power amplifier is to use a controller to adjust the capacitance of the programmable capacitor to reduce second harmonic signal, which is twice the frequency of the input signal, at the output terminal for each operating frequency of the differential voltage signal. As shown in FIG. 1, the programmable capacitor 101 would be a major contributor to the center-tap impedance at the operating frequency. By tuning the capacitance, the center-tap impedance can be easily adjusted. As the examples shown in FIG. 2, when the capacitance of the programmable capacitor is tuned to a specific value of 1.25 pF, the second harmonic at 14 GHz which is twice of 7 GHZ, the operating frequency of the power amplifier, the second harmonic power density can be minimized.

In general, the programmable capacitor is provided as one that can be electronically controlled by an external controller using control signals. The specific control mechanism depends on the type of programmable capacitor used. For example, the programmable capacitor is a digitally controlled capacitor, which features digital control inputs that accept binary or digital signals to select or adjust the capacitance value. These control inputs can be connected to a microcontroller, digital potentiometer, or other digital control circuitry. The control signals determine the desired capacitance setting, and the programmable capacitor adjusts its internal configuration accordingly.

In another example, the programmable capacitor can be controlled by an analog control voltage to determine the desired capacitance value, and the capacitor adjusts its internal configuration to achieve that value. This control voltage can be generated using digital-to-analog converters (DACs), voltage dividers, or other analog control circuitry.

In another example, the programmable capacitor may have a mechanical control mechanism. This can involve usage of mechanical actuators or switches to physically modify the capacitor's structure and change its effective capacitance. Optionally, the switch may be electrically controlled.

In an embodiment, the method proposed above may be applied in various applications where the harmonic controls are necessary. For example, in telecommunications where wideband power amplifiers are used to amplify signals in the RF (Radio Frequency) range, or in wireless communications where signals in the desired frequency range are amplified, or in Radar system where wideband power amplifiers typically operate over a wide frequency range, enabling precise detection of targets and accurate estimation of their characteristics, including distance, speed, and direction requiring low-noise amplification. It also can be applied in test and measurement application. Power amplifier device size is relatively large and has good amount of parasitic inductance and capacitance distributed. The common-mode impedance is also affected by off-chip parasitic in the package and board levels, making the accurate modeling difficult and time-consuming. Thus, the method of using a programmable capacitor to tune the center-tap impedance in the test measurements also helps adjust the common-mode impedance seen by the common-mode signal at the output terminal. Thus, the development cycle for the power amplifier can be reduced.

While the above is a full description of the specific embodiments, various modifications, alternative constructions and equivalents may be used. Therefore, the above description and illustrations should not be taken as limiting the scope of the subject technology which is defined by the appended claims.

What is claimed is:

1. An apparatus comprising:

a first circuit comprising a first transistor and a second transistor coupled respectively to a third transistor and a fourth transistor, the first transistor comprising a first gate configured to receive a first voltage input, the second transistor comprising a second gate configured to receive a second voltage input, the third transistor comprising a source coupled to a drain of the first transistor, and the fourth transistor comprising a source coupled to a drain of the second transistor;

a second circuit comprising a transformer having a first winding and a second winding, the first winding comprising a first terminal coupled to a drain of the third transistor and a second terminal coupled to a drain of the fourth transistor, the first winding being configured to draw a current associated with a differential voltage signal based on the first voltage input and the second voltage input, the second winding comprising a third terminal being grounded via a sixth resistor and a fourth terminal serving as an output terminal; and a third circuit comprising a first resistor, a second common node, a second resistor, a programmable capacitor, a third resistor, a first common node, and a fourth resistor coupled in series sequentially from a midpoint of the first winding to a ground terminal.

2. The apparatus of claim 1, further comprising a fourth circuit comprising a fifth resistor having a first terminal coupled to a DC voltage VDD and a second terminal coupled to the second common node connecting to both the first resistor and the second resistor.

3. The apparatus of claim 1, wherein the programmable capacitor comprises a switched capacitor array.

4. The amplifier of claim 1, wherein the programmable capacitor comprises a digitally controlled capacitor.

5. The apparatus of claim 1, wherein the programmable capacitor comprises a MEMS-based capacitor.

6. The apparatus of claim 1, wherein the programmable capacitor comprises a capacitance that is adjustable in a range from 0.1 pF to 10 μF by a controller based on frequency of the differential voltage signal in a range from 1 MHz to 19 GHz to reduce a second harmonic signal at the output terminal by at least 10 dBm.

7. The apparatus of claim 1, wherein the first voltage input comprises a first voltage signal at a frequency selected from 1 MHz to 19 GHz, the second voltage input comprises a second voltage signal with a same value of the first voltage signal but in opposite polarity at the same frequency.

8. The apparatus of claim 1, wherein the third transistor and the fourth transistor comprise a common gate being grounded.

9. The apparatus of claim 1, wherein the first transistor comprises a source coupled to a seventh resistor which is coupled to the first common node.

10. The apparatus of claim 1, wherein the second transistor comprises a source coupled to an eighth resistor which is coupled to the first common node.

11. An apparatus comprising:

a first pair of transistors configured to receive a first voltage input and a second voltage input respectively at their gate terminals;

a second pair of transistors comprising respective sources coupled to respective drains of the first pair of transistors, the second pair of transistors being configured to provide a differential voltage signal based on the first voltage input and the second voltage input;

a transformer comprising a primary winding and a secondary winding, the primary winding being coupled to respective drains of the second pair of transistors to receive a current signal associated with the differential voltage signal, the primary winding comprising a midpoint that separates the primary winding to two sections with equal resistances, the secondary being coupled between a ground terminal and an output terminal; and at least a programmable capacitor coupled between the midpoint of the primary winding and a first common node that is coupled to the first pair of transistors;

wherein the differential voltage signal comprises a frequency range from 1 MHz to 19 GHz.

12. The apparatus of claim 11, further comprises a first resistor coupled between the midpoint of the primary winding to a second common node, a second resistor coupled between the second common node and the programmable capacitor, a third resistor coupled between the programmable capacitor and the first common node, a fourth resistor coupled between the first common node and ground.

13. The apparatus of claim 12, further comprising a fifth resistor coupled between a DC voltage VDD and the second common node.

14. The apparatus of claim 13, further comprising a sixth resistor coupled between the secondary winding and ground, a seventh resistor coupled between a drain of a first one of the first pair of transistors and the first common node, and an eighth resistor coupled between a drain of a second one of the first pair of transistors and the first common node.

15. The apparatus of claim 11, wherein the programmable capacitor comprises a switched capacitor array.

16. The apparatus of claim 11, wherein the programmable capacitor comprises a MEMS-based capacitor.

17. The apparatus of claim 11, wherein the programmable capacitor comprises a capacitance that is adjustable in a range from 0.1 pF to 10 μF to reduce a second harmonic signal at the output terminal by at least 10 dBm.

18. A method for suppressing second harmonic in wide-band power amplifier, the method comprising:

configuring a first pair of transistors to have respective two gates to receive a first voltage input and a second voltage input respectively;

configuring a second pair of transistors to provide a differential voltage signal based on the first voltage input and the second voltage input;

providing a transformer comprising a first winding and a second winding, the first winding comprising a midpoint that separates the first winding to two sections with equal resistances;

coupling the first winding between respective drains of the second pair of transistors to receive a current signal associated with the differential voltage signal;

coupling the second winding between a ground terminal and an output terminal;

coupling at least a programmable capacitor between the midpoint of the first winding and a first common node that is coupled to respective sources of the first pair of transistors, the programmable capacitor being configured to allow capacitance adjustment from 0.1 pF to 10 μF;

coupling a power supply to a second common node of the center-tap line that is connected to the midpoint of the first winding via a first resistor and connected to the programmable capacitor via a second resistor; and coupling the first common node to the programmable capacitor via a third transistor and to ground via a fourth resistor.

19. The method of claim 18, further comprising using a controller to adjust the capacitance of the programmable capacitor to reduce second harmonic signals at the output terminal for each frequency of the differential voltage signal.

* * * * *